US006529542B1

(12) United States Patent
Karlsen et al.

(10) Patent No.: US 6,529,542 B1
(45) Date of Patent: Mar. 4, 2003

(54) INCOHERENT BEAM COMBINED OPTICAL SYSTEM UTILIZING A LENS ARRAY

(75) Inventors: Scott R. Karlsen, Lynnwood, WA (US); Jason N. Farmer, Kenmore, WA (US); Dennis D. Lowenthal, Edmonds, WA (US)

(73) Assignee: Aculight Corporation, Bothell, WA (US)

( * ) Notice: Subject to any disclaimer, the term of this patent is extended or adjusted under 35 U.S.C. 154(b) by 0 days.

(21) Appl. No.: 09/690,233

(22) Filed: Oct. 17, 2000

Related U.S. Application Data

(60) Provisional application No. 60/195,256, filed on Apr. 4, 2000.

(51) Int. Cl.[7] ................................................. H01S 3/08
(52) U.S. Cl. ......................... 372/108; 372/50; 372/101; 372/102
(58) Field of Search ............................. 372/108, 101, 372/50, 6, 102, 92, 97

(56) References Cited

U.S. PATENT DOCUMENTS

| | | | |
|---|---|---|---|
| 4,494,235 A | 1/1985 | Guch, Jr. et al. ............. 372/23 |
| 4,822,151 A * | 4/1989 | Tatsuno et al. ............. 356/365 |
| 4,913,525 A | 4/1990 | Asakura et al. ........ 350/162.12 |
| 4,923,270 A | 5/1990 | Carter ..................... 350/96.18 |
| 5,007,698 A | 4/1991 | Sasaki et al. ............ 350/96.15 |
| 5,052,013 A | 9/1991 | Putnam ....................... 372/97 |
| 5,115,444 A * | 5/1992 | Kirkby et al. ............... 372/50 |
| 5,136,420 A | 8/1992 | Inagaki et al. ............. 359/341 |
| 5,163,058 A * | 11/1992 | Farris et al. .................. 372/6 |
| 5,276,695 A | 1/1994 | Scheps ........................ 372/20 |
| 5,351,262 A | 9/1994 | Poguntke et al. ........... 372/102 |
| 5,386,426 A * | 1/1995 | Stephens .................... 372/101 |
| 5,390,201 A | 2/1995 | Tomono et al. ............... 372/22 |
| 5,450,232 A | 9/1995 | Sasaki et al. ............... 359/341 |
| 5,513,201 A | 4/1996 | Yamaguchi et al. .......... 372/75 |
| 5,541,946 A | 7/1996 | Scheps et al. ................ 372/23 |
| 5,771,252 A * | 6/1998 | Lang et al. ................. 372/102 |
| 5,773,345 A | 6/1998 | Ota ............................ 438/286 |
| 5,802,092 A | 9/1998 | Endriz ......................... 372/50 |
| 6,304,585 B1 * | 10/2001 | Sanders et al. ............. 359/326 |
| 6,370,290 B1 * | 4/2002 | Ball et al. ..................... 358/14 |

* cited by examiner

*Primary Examiner*—Paul Ip
*Assistant Examiner*—Delma R. Flores Ruiz
(74) *Attorney, Agent, or Firm*—Bingham McCutchen, LLP; David G. Beck

(57) ABSTRACT

A method and apparatus is provided that enables an IBC system to operate over a large field angle. As a consequence, wide laser gain arrays can be used providing greater control over the output power and the bandwidth of the IBC system. The IBC resonator cavity is comprised of a reflector, preferably deposited on the back facets of the gain element array, and an output coupler. Interposed between the array and the output coupler is a wavelength dispersive element, such as a diffraction grating, and a collimating optic. A lens system, comprised of either a single cylindrical lens, a single cylindrical lens in combination with an array of orthogonally positioned cylindrical lens elements, or an array of individual lens elements, is located between the laser gain array and the collimating optic. At a minimum, the lens system reduces the divergence of the light from each emitter in the fast axis, thus allowing smaller, less optically complex optics to be used for the IBC resonator optics.

27 Claims, 4 Drawing Sheets

INCOHERENT BEAM COMBINED OPTICAL SYSTEM UTILIZING A LENS ARRAY

CROSS-REFERENCES TO RELATED APPLICATIONS

This application claims priority of provisional patent application Ser. No. 60/195,256 filed Apr. 4, 2000, the disclosure of which is incorporated herein by reference for all purposes.

GOVERNMENT RIGHTS NOTICE

This invention was made with Government support under Contract No. F29601-99-C-0013 awarded by the Air Force. The Government has certain rights in the invention.

FIELD OF THE INVENTION

The present invention relates generally to incoherently beam combined (IBC) lasers and, more particularly, to a system for increasing the available power and/or bandwidth of an IBC laser.

BACKGROUND OF THE INVENTION

In many applications utilizing laser sources, it is desirable to use a source providing diffraction limited power within a specific bandwidth. This bandwidth may be comprised of multiple distinct wavelengths or as a spectrally smooth or continuous distribution of wavelengths.

A suitable source for many of these applications is an Incoherently Beam Combined or IBC laser. In an IBC laser, an external cavity is used to incoherently combine the output from each of an array of single transverse mode, laser gain elements. The external cavity is comprised of the back facet of each gain element and a common output coupler. A reflective or transmissive dispersive element, such as a grating, is located within the cavity and is used to simultaneously force each element of the array to oscillate at a distinct wavelength and combine all of the beams. By using a large number of laser gain elements or emitters, an IBC laser can generate a relatively high power, diffraction limited, laser beam.

In order to increase the power and/or bandwidth of an IBC laser, additional laser gain elements or emitters must be added to the array. Although the F-number of the IBC resonator optics is set by the divergence of an individual emitter and thus is unaffected by an increase in array width, the field angle over which the IBC optics must operate is directly driven by the array width and thus the number of emitters. Consequently, as the number of emitters is increased, the resonator cavity optics become increasingly difficult to manufacture in terms of size, optical design complexity, and cost.

Accordingly, what is needed in the art is an optically simple IBC system that can operate over the relatively large field angles required by a wide laser gain array. The present invention provides such a system.

SUMMARY OF THE INVENTION

The present invention provides a method and apparatus that enables an IBC system to operate over a large field angle, thus allowing wide laser gain arrays to be used in a compact package. The IBC optical cavity is formed by the combination of a high reflectance coating applied to the back facet of each emitter of the gain array and an external output coupler. Located within the IBC optical cavity is a wavelength dispersive element, such as a diffraction grating, and a collimating optic, the shape of which may be aspheric.

According to the invention, a lens is placed within the IBC optical cavity, the lens being located between the laser gain array and the collimating optic. In at least one embodiment of the invention, the lens is comprised of a single cylindrical lens that reduces the divergence of the light emitted by the individual emitters in the fast axis while having negligible impact on the divergence of the light in the slow axis. Preferably the divergence in the fast axis is reduced to match that of the slow axis, thereby relaxing the on-axis F-number requirements of the cavity optics to those of the slow axis. The lens shape may be aspheric.

In at least a second embodiment of the invention, the lens placed between the laser gain array and the collimating optic is comprised of an array of individual lens elements, each lens element corresponding to an individual emitter of the array. The lens elements reduce the divergence of each emitter in the fast axis, preferably such that the divergence in the fast axis matches the divergence in the slow axis.

In at least a third embodiment of the invention, the lens placed between the laser gain array and the collimating optic corrects for the astigmatism of the edge emitters. This optical correction can be accomplished with a single lens array comprised of a plurality of lens elements, each of which is an aspheric lens having a different focal length in the slow and fast axes. The lens shape may be aspheric in both the slow and fast axes. Alternately, a single cylindrical lens acting substantially on one axis of the emitter array can be combined with an array of cylindrical lenses acting substantially on the orthogonal axis of the emitter array to correct for the astigmatism of the edge emitters.

A further understanding of the nature and advantages of the present invention may be realized by reference to the remaining portions of the specification and the drawings.

DESCRIPTION OF THE SPECIFIC EMBODIMENTS

Figure 1:
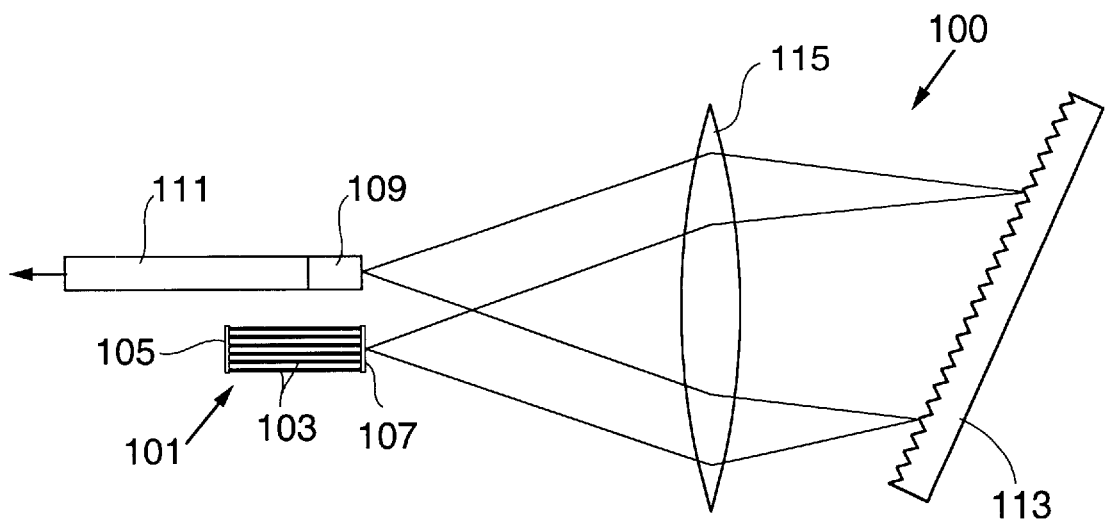
FIG. 1 is a schematic illustration of an IBC laser system according to the prior art.

FIG. 1 schematically illustrates an IBC laser system 100 in accordance with the prior art. System 100 uses a laser array 101 comprised of a plurality of individual gain elements or emitters 103, all with nominally the same center wavelength. The back facet of each emitter 103 is coated with a high reflectance coating 105 while the front facet of each emitter 103 is coated with an anti-reflection (AR) coating 107. AR coating 107 insures that the external cavity rather than the cleaved facets of the gain elements set the lasing wavelength. The optical cavity is formed by the combination of high reflectance coating 105 and an external output coupler 109. As shown, in this embodiment external output coupler 109 is integral to, and embedded within, an optical waveguide 111.

Located within the optical cavity of IBC laser system 100 is a wavelength dispersive element 113. As shown, wavelength dispersive element 113 is a reflective diffraction grating. It is understood that other types of dispersive elements, including both reflective and transmissive elements, can also be used within system 100. Also located within the optical cavity is a lens 115 which collimates the light from each emitter 103 and focuses the light diffracted by grating 113 onto output coupler 109. It is understood that a reflective collimating optic can also be used within system 100. Typically array 101 is located at approximately one focal length distance from lens 115.

Differentiation of the grating equation yields $$\Delta\lambda = d(W_{bar}/f)\cos(\theta_{in})$$

where $\Delta\lambda$ is the bandwidth of the IBC laser, d is the grating line spacing, $W_{bar}$ is the width of the laser gain element array, f is the collimation optic focal length, and $\theta_{in}$ is the incident angle on the grating. This equation shows that the bandwidth of the IBC laser is directly related to the focal length of the collimating optic, the grating grove spacing, and the array width. Accordingly the bandwidth of such a laser, unlike a more conventional laser, can be optimized for a specific application.

Although the bandwidth of an IBC laser can be optimized for different applications, there are a number of design considerations that must be taken into account when using a gain element array consisting of single transverse mode, edge-emitting semiconductor lasers. First, the resonator must be astigmatic in order to mode match the output of the semiconductor lasers. Mode matching is required to insure operational efficiency. Second, the system must be designed to minimize aberrations, a difficult optical design task due to the large emission angles involved and due to the divergence angle within the plane which is perpendicular to the array (i.e., the fast axis) being different from that within the plane which is parallel to the array (i.e., the slow axis). For this type of emitter, the F-number for the fast axis is typically about F/1 while the F-number for the slow axis is typically about F/3. Additionally, as the resonator optics must operate at F/3 over a field angle defined by the ratio of the bar width to the focal length, this design task becomes increasingly more difficult as the array width is increased.

Assuming a single spherical optic (i.e., simple spherical mirror or thin lens) as shown in the prior art and as illustrated in FIG. 1, and assuming an emitter slow axis F-number of F/3, spherical aberration limits the maximum useable focal length of lens 115 to approximately 25 millimeters. Coma limits the maximum diode bar length to approximately 1.3 millimeters. At an emitter wavelength of 1500 nanometers, diode arrays can be custom manufactured with a linear power density of 5 Watts per centimeter. With a 1.3 millimeter bar width, and assuming 100 percent cavity efficiency, the maximum achievable IBC laser power in this design is 0.8 Watts.

Power scaling for a conventional IBC laser system can be achieved through the use of a large lens group. Due to the divergence of the fast axis, this lens group must perform at F/1 on axis without introducing aberrations. Furthermore, it must be able to operate over the slow axis field angle at F/3 without introducing aberrations. As a result of these requirements, the lens group must use large optics with custom radii and highly aspheric surfaces. Such a design does not lend itself to compact packaging or inexpensive optics.

Figure 2:
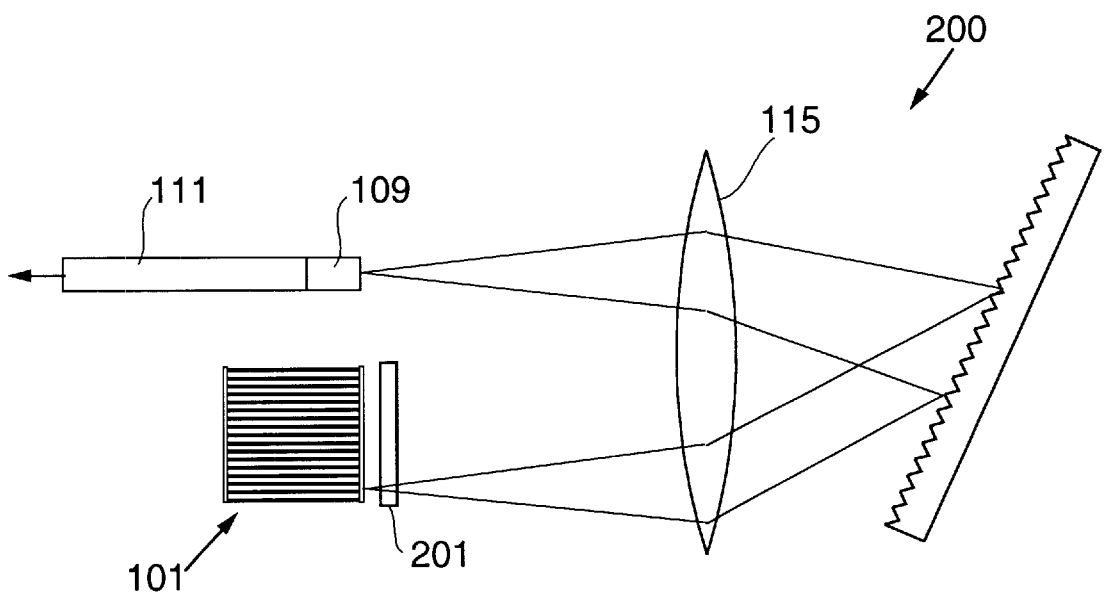
FIG. 2 is a schematic illustration of an IBC laser system according to the invention.

FIG. 2 is a schematic illustration of one embodiment of the invention. IBC optical system 200 is the same as system 100 except for the inclusion of a lens or lens array 201. Lens 201 is located between laser array 101 and lens 115. In the preferred embodiment, lens 201 is immediately adjacent to AR coated front facets 107 of emitters 103. Lens 201 reduces the divergence of emitters 103 thus allowing laser array 101 to be much wider, or alternately, to be comprised of multiple individual arrays, while maintaining a relatively simple resonator optical design. As a consequence, much higher output powers and/or narrower bandwidths can be achieved without utilizing an exceedingly complex optical design.

Figure 3:
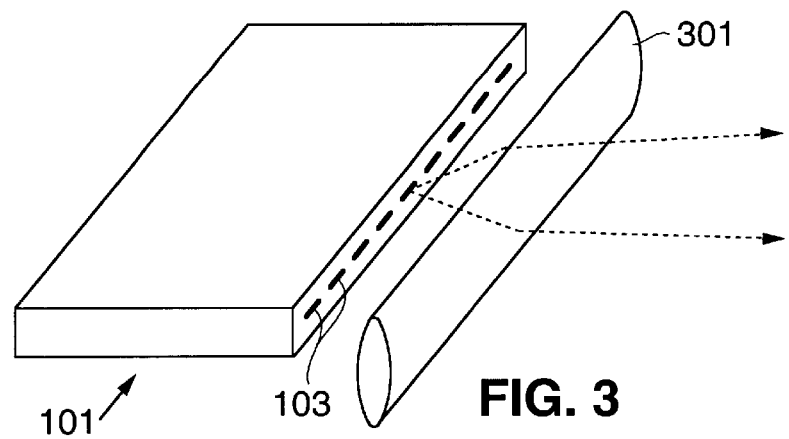
FIG. 3 is a schematic illustration of one embodiment of a lens system that can be used in the IBC system shown in FIG. 2.

FIG. 3 is a schematic illustration of one aspect of at least one embodiment of the invention. As shown, lens 301 is a fast cylindrical lens such as can be obtained from Blue Sky or LIMO. Lens 301 reduces the divergence of the light emitted by emitters 103 in the fast axis while having negligible impact on the divergence of the light in the slow axis. Preferably the divergence in the fast axis is reduced to match that of the slow axis, thereby relaxing the on-axis F-number requirements of the cavity optics to those of the slow axis.

Figure 4:
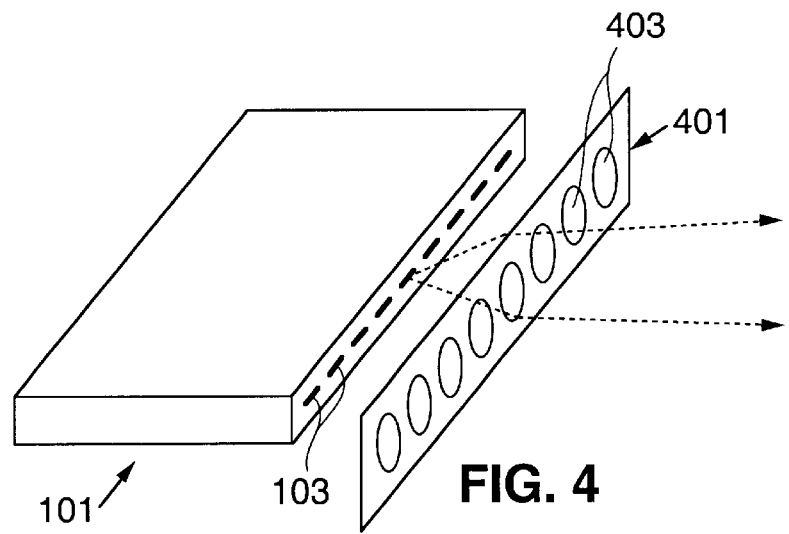
FIG. 4 is a schematic illustration of a second embodiment of a lens system that can be used in the IBC system shown in FIG. 2.

FIG. 4 is a schematic illustration of another lens that can be used to implement the present invention. As opposed to a single cylindrical lens as shown in FIG. 3, lens array 401 is comprised of a plurality of individual lens elements 403, each lens element 403 acting upon the emissions of a single emitter 103. By reducing the divergence of each emitter 103, and preferably reducing the divergence of the fast axis such that it substantially matches the divergence of the slow axis, the field angle over which the remainder of the cavity optics must operate is greatly increased. Lens array 401 can be fabricated using a variety of techniques, such as photolithography.

Figure 5:
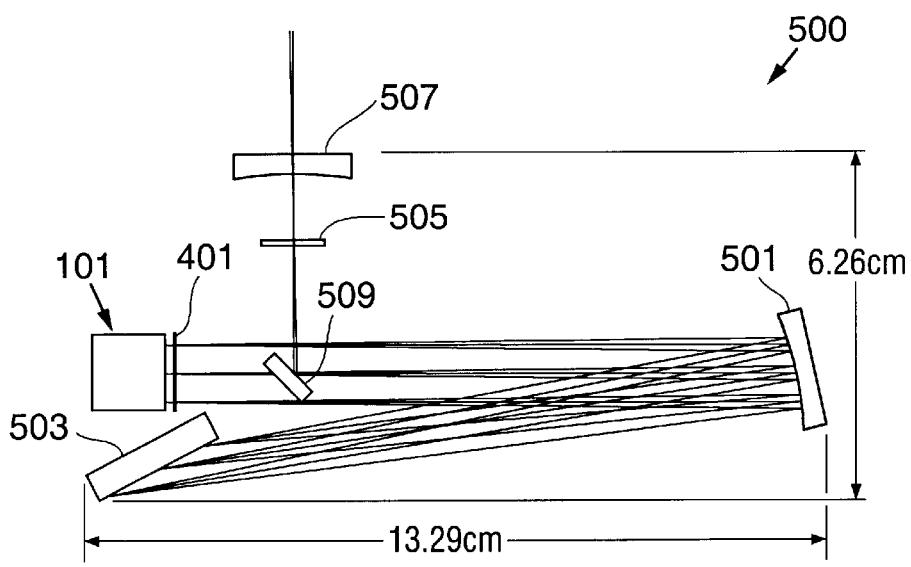
FIG. 5 is a schematic illustration of an IBC laser system using a lens array and a pick-off mirror in accordance with the invention.

FIG. 5 is an example of an IBC laser system according to the present invention utilizing a lens array 401. It is understood that a cylindrical lens, such as the lens shown in FIG. 3, can also be used in this system. Additionally, IBC cavity optics include emitter back facet high reflectance coatings 105, emitter front facet AR coatings 107, imaging mirror 501, reflective diffraction grating 503, slit 505, and output coupler 507. In this embodiment the beam is deflected out of plane, thus allowing the use of a pick-off mirror 509. Lens elements 403 of array 401 have a center-to-center spacing matching that of emitters 103, typically on the order of 10–500 micrometers. Array 401 significantly reduces the output beam divergence of the emitters, from approximately ±10 degrees to nominally ±1 degree. As a result, the F-number over which the mirror must operate is increased from F/3 to F/30, thereby essentially removing any practical constraints on mirror focal length or diode bar width due to spherical and comatic aberrations. Additionally, the reduced angular divergence from array 101 also reduces the size of the IBC resonator optics, allowing small, inexpensive optical components to replace large, expensive components. As shown, the overall length of IBC system 500 is only 13.3 centimeters.

Figure 6:
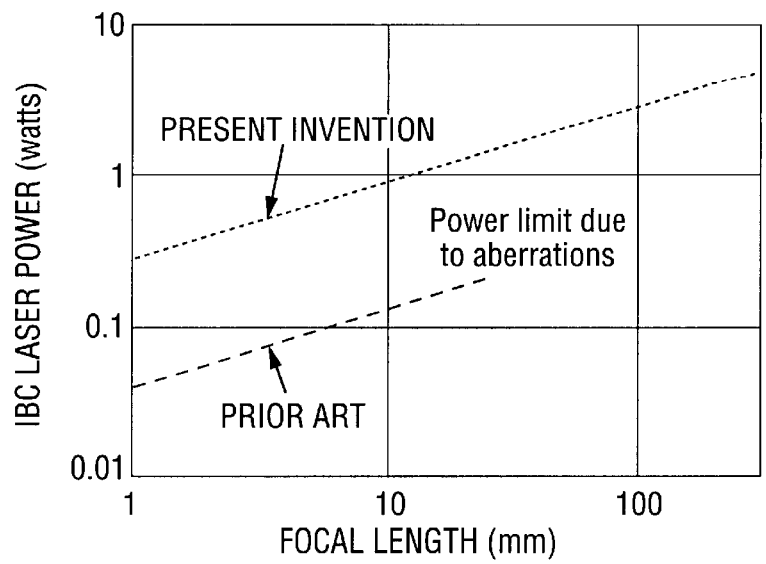
FIG. 6 graphically illustrates the maximum achievable power as a function of the focal length of the collimating optic for a conventional IBC laser system and an IBC laser system designed in accordance with the present invention.

As previously described, due to aberration scaling the maximum useable focal length in a conventional IBC system is given by the spherical aberration while the maximum useable array width is given by the comatic aberration. In an IBC system utilizing the present invention in which the focal length is shorter than the maximum possible, astigmatic aberrations limit the maximum useable array width. FIG. 6 graphically illustrates the maximum achievable output power as a function of the focal length of the collimating optic for both a conventional IBC laser and one fabricated in accordance with the invention, assuming a diode laser emitting 5 Watts per centimeter. This graph clearly shows the benefits that can be realized with the present invention.

Figure 7:
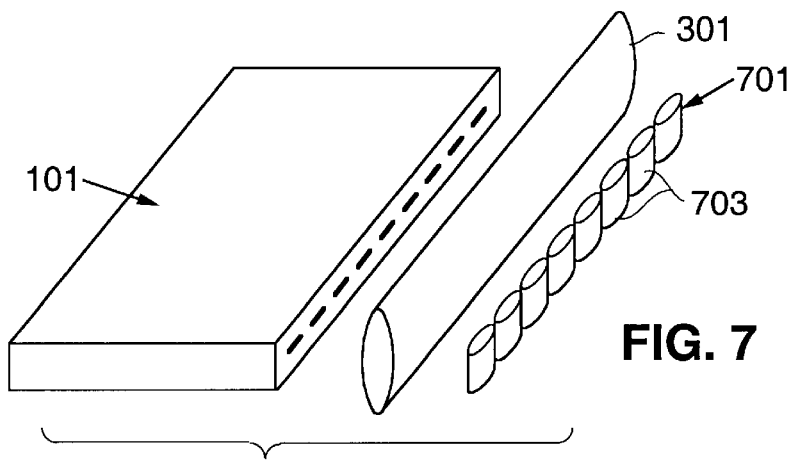
FIG. 7 is a schematic illustration of a third embodiment of a lens system that can be used in the IBC system shown in FIG. 2.
Figure 8:
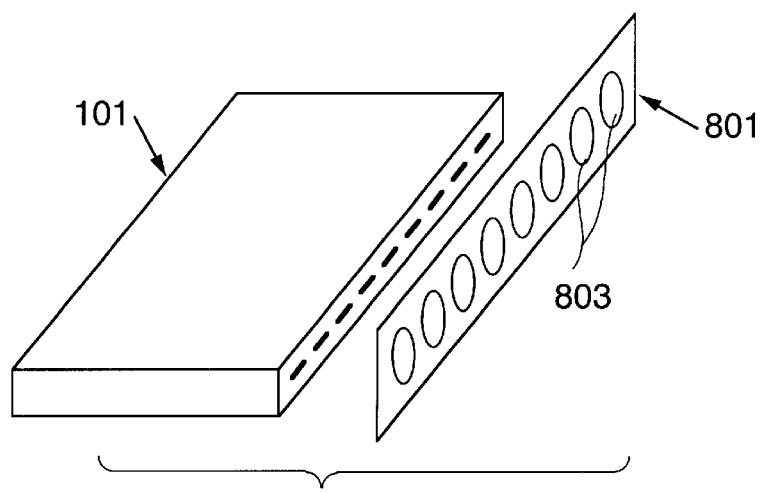
FIG. 8 is a schematic illustration of a fourth embodiment of a lens system that can be used in the IBC system shown in FIG. 2.

FIGS. 7 and 8 illustrate two alternate lens assemblies that can be used to condition the output of the emitter array, thus allowing for relatively simple IBC laser systems as described relative to FIGS. 2 and 5. As previously described, lens 301 shown in FIG. 7 is a fast cylindrical lens which reduces the divergence of the light emitted by emitters 103 in the fast axis while having negligible impact on the divergence of the light in the slow axis. Lens 701 is comprised of a plurality of lens elements 703 with a center-to-center spacing matching that of emitters 103. Each lens element 703 is a cylindrical lens designed to reduce the divergence of the light emitted by emitters 103 in the slow axis while having negligible effect on the divergence of the light in the slow axis. By combining the effects of lens 301 with lens array 701 the astigmatism of the edge emitters is corrected. The astigmatism of the edge emitters can also be corrected, as shown in FIG. 8, using a lens array 801 comprised of a plurality of lens elements 803, each of which is an aspheric lens having a different focal length in the slow and fast axes.

Figure 9:
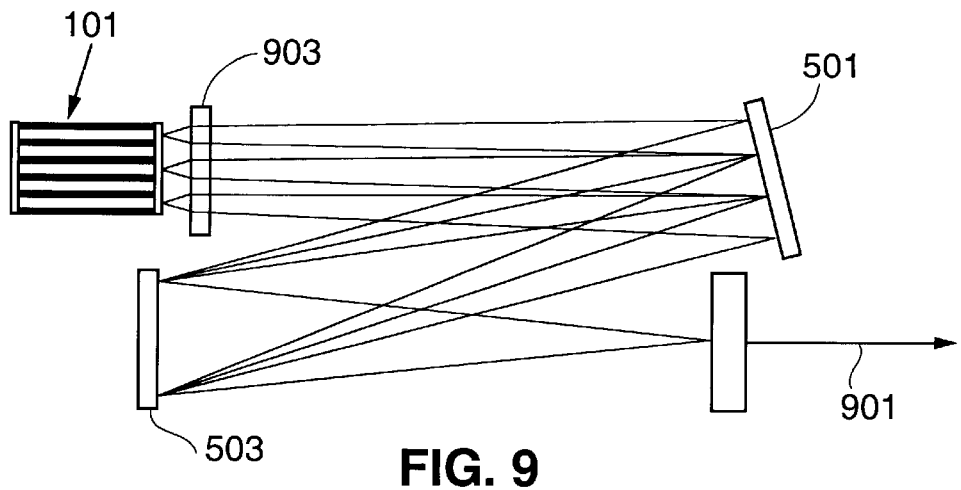
FIG. 9 is a schematic illustration of an alternate IBC laser system in accordance with the invention.
Figure 10:
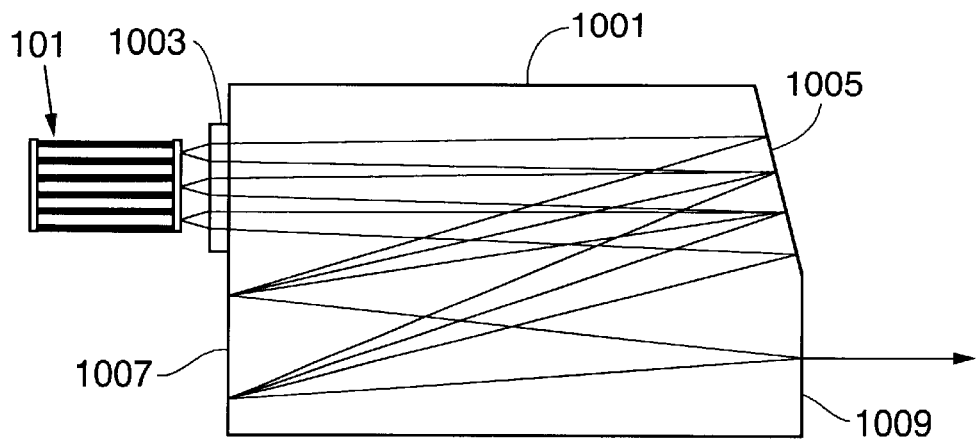
FIG. 10 is a schematic illustration of an alternate IBC laser system in accordance with the invention.

The present invention can be embodied in a variety of different IBC laser systems depending upon the constraints placed on the optical packaging as well as the power and bandwidth requirements of the system. For example, a minor variation of the system illustrated in FIG. 5 is shown in FIG. 9. In this embodiment instead of using pick-off mirror 509, the system is configured such that output beam 901 is in the same plane and has the same beam direction as the output of emitters 103. Optic 903 can be comprised of any of the previously described lens systems (e.g., 201, 301, 401, 301/701, and 801). In the embodiment illustrated in FIG. 10, a particularly robust system is shown in which a single optical element 1001 serves multiple purposes. The entrance of element 1001 includes a lens element 1003 as previously disclosed to condition the output of emitters 103. Optical element 1001 can either be ground to provide lens surface 1003, or a separate lens/lens array can be fabricated and bonded to element 1001 using an optically transparent adhesive. Imaging reflector 1005 is ground to provide the proper magnification and coated with a suitable high reflectance coating. A diffraction grating 1007 is either fabricated onto the surface of element 1001, for example using photolithographic techniques, or separately fabricated and bonded to the surface of element 1001. Final surface 1009 of element 1001 is coated with a suitable output coupler. To further increase the robustness of the device, array 101 can be bonded to element 1001 using an optically transparent adhesive.

Figure 11:
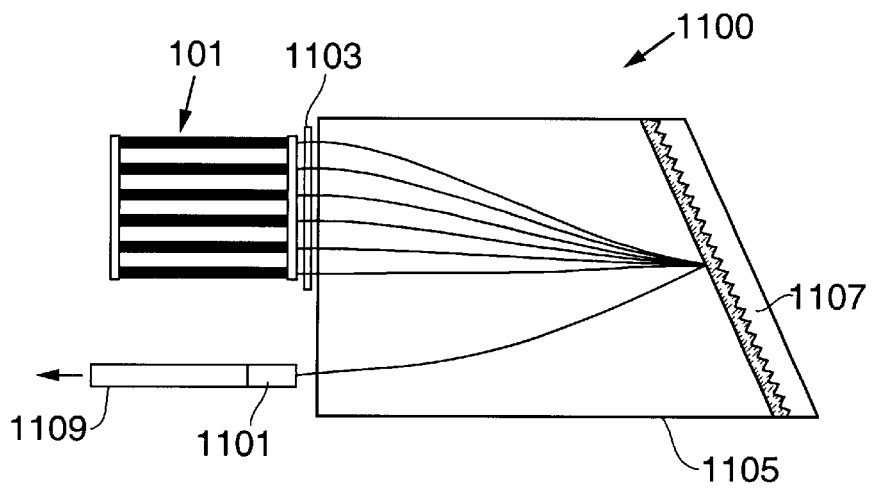
FIG. 11 is a schematic illustration of an IBC laser system utilizing a GRIN optical element and a lens system in accordance with the invention.

FIG. 11 is an illustration of another alternate embodiment of the invention. In this embodiment the resonator cavity of IBC laser system 1100 is comprised of high reflectance coating 105 applied to the back facets of array 101 and an output coupler 1101. Interposed between array 101 and output coupler 1101 is a lens system 1103 in accordance with the invention (e.g., 201, 301, 401, 301/701, and 801), a gradient index or GRIN lens 1105, and a reflective diffraction grating 1107. Preferably output coupler 1101 is directly coupled to an optical fiber 1109, preferably a single mode fiber. Output coupler 1101 can be buried within fiber 1109, attached to fiber 1109 with an index matching, optically transparent adhesive, or directly deposited onto the cleaved end facet of fiber 1109. GRIN lens 1105 is approximately a ¼ pitch GRIN lens with diffraction grating 1107 either bonded directly to an end face of the GRIN lens or fabricated directly onto the end face of the GRIN lens. Lens system 1103 can be completely separate from GRIN lens 1105 as shown. Alternately lens system 1103 can be bonded directly to the GRIN lens 1105 or fabricated onto the front surface of GRIN lens 1105.

In at least one embodiment of the invention, the conic constant of the lens array (e.g., array 401), the focal length of the individual lens elements (e.g., 403), or the thickness of each lens element (e.g., 403) is varied across the array. This technique can be used to correct the off axis aberrations associated with an IBC resonator employing a large number of emitters and hence operating over a large field angle. It is understood that this technique can be used with any of the previously described embodiments utilizing an array of individual lens elements.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. An incoherently beam combined (IBC) laser system comprising:

a laser gain array comprised of a plurality or emitters, wherein an emission from each of said emitters is astigmatic;

an IBC resonator cavity comprising:
a plurality of reflectors corresponding to said plurality of emitters; and
an external output coupler;

a wavelength dispersive element interposed between said laser gain array and said external output coupler;

a collimating optical element interposed between said laser gain array and said wavelength dispersive element; and a divergence reducing lens assembly interposed between said laser gain array and said collimating optical element, said divergence reducing lens assembly reducing divergence in said emission from each of said plurality of emitters in at least a first axis.

2. The IBC laser system of claim 1, wherein said plurality of reflectors is comprised of a high reflectance coating applied to a back facet of each of said plurality of emitters.

3. The IBC laser system of claim 1, further comprising an anti-reflection (AR) coating applied to a front facet of each said plurality of emitters.

4. The IBC laser system of claim 1, wherein divergence in said at least said first axis is reduced by said divergence reducing lens assembly to match a divergence in a second axis, said second axis orthogonal to said first axis.

5. The IBC laser system of claim 1, wherein said divergence reducing lens assembly is comprised of a cylindrical lens.

6. The IBC laser system of claim 5, wherein said divergence reducing lens assembly is further comprised of a plurality of cylindrical lens elements, wherein a center-to-center spacing of said plurality of lens elements matches an emitter spacing, and wherein said cylindrical lens reduces divergence in said first axis and said plurality of lens elements reduce divergence in a second axis, said second axis substantially orthogonal to said first axis.

7. The IBC laser system of claim 1, wherein said divergence reducing lens assembly is comprised of a plurality of lens elements, wherein a center-to-center spacing of said plurality of lens elements matches an emitter spacing.

8. The IBC laser system of claim 7, wherein said plurality of lens elements are aspheric lens elements.

9. The IBC laser system of claim 1, wherein said output coupler is coupled to an optical fiber.

10. The IBC laser system of claim 1, wherein said output coupler is buried within an entrance aperture of an optical fiber.

11. The IBC laser system of claim 1, wherein said laser gain array is comprised of at least two separate gain arrays, wherein said at least two separate gain arrays are co-aligned.

12. The IBC laser system of claim 1, wherein said wavelength dispersive element is comprised of a diffraction grating.

13. The IBC laser system of claim 1, wherein said collimating optical element is a mirror.

14. An IBC laser system comprising:
    a laser gain array comprised of a plurality of emitters, wherein an emission from each of said emitters is astigamatic;
    an IBC resonator cavity comprising:
        a plurality of reflectors corresponding to said plurality of emitters; and
        an external output coupler;
        a reflective diffraction grating interposed between said laser gain array and said external output coupler;
        a GRIN lens interposed between said laser gain array and said reflective diffraction grating; and
        a divergence reducing lens assembly interposed between said laser gain array and said GRIN lens, said divergence reducing lens assembly reducing divergence in said emission from each of said plurality of emitters in at least a first axis.

15. The IBC laser system of claim 14, wherein said reflective diffraction grating is bonded to said GRIN lens with an index matching adhesive.

16. The IBC laser system of claim 14, wherein said reflective diffraction grating is etched into said GRIN lens.

17. The IBC laser system of claim 14, wherein said divergence reducing lens assembly is etched into said GRIN lens.

18. The IBC laser system of claim 14, wherein said divergence reducing lens assembly is comprised of a cylindrical lens.

19. The IBC laser system of claim 18, wherein said divergence reducing lens assembly is further comprised of a plurality of cylindrical lens elements, wherein a center-to-center spacing of said plurality of lens elements matches an emitter spacing, and wherein said cylindrical lens reduces divergence in said first axis and said plurality of lens elements reduce divergence in a second axis, said second axis orthogonal to said first axis.

20. The IBC laser system of claim 14, wherein said divergence reducing lens assembly is comprised of a plurality of lens elements, wherein a center-to-center spacing of said plurality of lens elements matches an emitter spacing.

21. The IBC laser system of claim 20, wherein said plurality of lens elements are aspheric lens elements.

22. The IBC laser system of claim 14, wherein said GRIN lens is a ¼ pitch GRIN lens.

23. An IBC laser system comprising:
    a laser gain array comprised of a plurality of emitters, wherein an emission from each of said emitters is astigmatic;
    an IBC resonator cavity comprising:
        a plurality of reflectors corresponding to said plurality of emitters; and
        an external output coupler;
    an optical element of a uniform optical index, wherein emissions from said plurality of emitters pass through an entrance aperture on a leading surface of said optical element;
    a reflective coating coupled to a shaped back surface of said optical element, wherein said reflective coating on said shaped back surface collimates said emission from said plurality of emitters;
    a reflective diffraction grating coupled to said leading surface of said optical element, wherein said collimated emissions from said plurality of emitters are reflected by said diffraction grating back through said optical element, wherein said reflective coating on said shaped back surface focuses said emissions reflected by said diffraction grating onto said external output coupler; and
    a divergence reducing lens assembly interposed between said laser gain array and said optical element, said divergence reducing lens assembly reducing divergence in said emission from each of said plurality of emitters in at least a first axis.

24. The IBC laser system of claim 23, wherein said divergence reducing lens assembly is comprised of a cylindrical lens.

25. The IBC laser system of claim 24, wherein said divergence reducing lens assembly is further comprised of a plurality of cylindrical lens elements, wherein a center-to-center spacing of said plurality of lens elements, matches an emitter spacing, and wherein said cylindrical lens reduces divergence in said first axis and said plurality of lens elements reduce divergence in a second axis, said second axis orthogonal to said first axis.

26. The IBC laser system of claim 23, wherein said divergence reducing lens assembly is comprised of a plurality of lens elements, wherein a center-to-center spacing of said plurality of lens elements matches an emitter spacing.

27. The IBC laser system of claim 26, wherein said plurality of lens elements are aspheric lens elements.

* * * * *